US007767365B2

(12) United States Patent
Carpenter et al.

(10) Patent No.: US 7,767,365 B2
(45) Date of Patent: Aug. 3, 2010

(54) METHODS FOR FORMING AND CLEANING PHOTOLITHOGRAPHY RETICLES

(75) Inventors: Craig M. Carpenter, Boise, ID (US); James Baugh, Boise, ID (US); Steve McDonald, Star, ID (US); Robert Rasmussen, Kuna, ID (US); J. Brett Rolfson, Boise, ID (US); Azeddine Zerrade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 751 days.

(21) Appl. No.: 11/515,089

(22) Filed: Aug. 31, 2006

(65) Prior Publication Data

US 2008/0057411 A1 Mar. 6, 2008

(51) Int. Cl.
*G03F 1/00* (2006.01)
(52) U.S. Cl. .................................. 430/5; 134/1; 216/67
(58) Field of Classification Search .................. 430/5; 216/47, 64, 24, 67; 134/1, 1.3; 438/710, 438/725
See application file for complete search history.

(56) References Cited

U.S. PATENT DOCUMENTS

| 4,687,543 | A |   | 8/1987 | Bowker |
| 5,728,494 | A | * | 3/1998 | Kawano et al. ............... 430/5 |
| 6,190,809 | B1 | * | 2/2001 | Tzu et al. ..................... 430/5 |
| 6,207,333 | B1 |   | 3/2001 | Adair et al. |
| 6,238,825 | B1 |   | 5/2001 | Lin |
| 6,242,165 | B1 |   | 6/2001 | Vaartstra |
| 6,482,728 | B2 |   | 11/2002 | Shin et al. |
| 6,576,374 | B1 |   | 6/2003 | Kim |
| 6,579,808 | B2 |   | 6/2003 | Cho et al. |
| 6,649,532 | B1 |   | 11/2003 | Chen et al. |
| 6,716,758 | B1 |   | 4/2004 | Donohue et al. |
| 6,902,851 | B1 |   | 6/2005 | Babcock et al. |
| 6,902,854 | B2 |   | 6/2005 | Frankowsky |

(Continued)

OTHER PUBLICATIONS

Eurlings et al., 0.11um imaging in KrF lithography using dipole illumination, SPIE proceedings (SPIE proc. Ser.) International Society for Optical Engineering proceedings series, 2001, pp. 2 pages.

(Continued)

*Primary Examiner*—Mark F Huff
*Assistant Examiner*—Stewart A Fraser
(74) *Attorney, Agent, or Firm*—Knobbe, Martens, Olson & Bear, LLP

(57) ABSTRACT

A method for removing impurities (e.g., atomic sulfur) from a reticle for use in photolithography is provided. In one embodiment, a reticle (or photomask) comprising a plate, a first layer over the plate, and a photoresist layer over the first layer is provided. The photoresist layer is removed with a first chemistry comprising a sulfur-containing compound. At least a portion of the first layer is removed with a second chemistry comprising a sulfur-containing etchant, thereby exposing portions of the plate. Removing the photoresist layer and/or at least a portion of the first layer leaves sulfur on at least portions of the reticle. In a cleaning step, the reticle is contacted with one or more excited species of oxygen to remove residual sulfur and other contaminants, such as carbon, sulfur and oxygen-containing species. Methods of embodiments can be used to clean, e.g., binary photomasks, attenuated phase shift masks (APSMs) and high transmission attenuated photomasks.

51 Claims, 13 Drawing Sheets

U.S. PATENT DOCUMENTS

| | | | |
|---|---|---|---|
| 6,919,274 | B2 | 7/2005 | Kazumi et al. |
| 6,939,794 | B2 | 9/2005 | Yin et al. |
| 6,969,895 | B2 | 11/2005 | Han et al. |
| 7,119,020 | B2 | 10/2006 | Okamura et al. |
| 7,131,102 | B2 | 10/2006 | Dai et al. |
| 7,271,106 | B2 | 9/2007 | Abatchev et al. |
| 2004/0072081 | A1* | 4/2004 | Coleman et al. ............... 430/5 |
| 2005/0009215 | A1 | 1/2005 | Goto et al. |
| 2005/0099078 | A1 | 5/2005 | Vanhaelemeersch et al. |
| 2005/0164478 | A1 | 7/2005 | Chan et al. |
| 2006/0019178 | A1* | 1/2006 | Lee et al. ..................... 430/5 |

OTHER PUBLICATIONS

"Advanced lithography: probing the limits of lithography," http://www.tpd.tno.nl/smartsite93.html, Mar. 2004, 3 pages.

Bergeron, "Resolution enhancement techniques for the 90-nm technology node and beyond," http://www.future-fab.com, Future Fab Intl., 2004, 10 pages.

Ha et al., "Reaction mechanism of trilevel resist etching in $O_2/SO_2$ plasma: controlling factors for sidewall passivation," Vacuum, Dec. 1998, pp. 519-524, abstract, vol. 51, Issue 4.

Higashi et al., "Identifying front-end chanllenges for 90nm design," Electronic Eng. Times Asia, Sep. 1, 2003, 3 pages.

Mancini et al., "S-FIL for sub-80nm contact hole patterning," Solid State Technology Magazine, Feb. 2004, 4 pages, vol. 47, Issue 2.

Peterson et al., "Approaches to reducing edge roughness and substrate poisoning of ESCAP photoresists," Semiconductor Fabtech, $8^{th}$ Edition, pp. 183-188.

Naulleau et al., "Line-edge roughness transfer function and its application to determining mask effects in EUV resist characterization," Applied Optics, Jun. 10, 2003, pp. 3390-3397, vol. 42, No. 17.

TCP 9400DFM—Silicon Etch Product Abstract, http://www.lamrc.com/products_5htm, Jul. 2004, 1 page.

* cited by examiner

METHODS FOR FORMING AND CLEANING PHOTOLITHOGRAPHY RETICLES

BACKGROUND OF THE INVENTION

1. Field of the Invention

The present invention relates to a method for forming a reticle for use in photolithography and, more particularly, to a method for cleaning a reticle.

2. Description of the Related Art

Optical systems are widely used in the microelectronics industry to manufacture semiconductor wafers by a process known as photolithography. Typically, a photolithography system comprises a light source configured to project light rays to a condenser lens. The condenser lens collimates the light rays towards a pellicle placed before (or after) a reticle, sometimes referred to as a photomask. Typically, the reticle includes an optically transparent substrate underlying an optically opaque layer in a pattern used to project an image onto a portion of a photoresist-coated wafer. The pellicle is a substantially thin, optically transparent film which seals off the reticle surface from airborne particulates and other forms of contamination. Typically, a projection lens is placed after the reticle to receive and focus the pattern of light rays onto an exposure field on a photoresist ("resist") layer overlying a wafer. Exposed or unexposed portions of the photoresist are then developed, replicating the reticle pattern in the photoresist layer.

Since the invention of the integrated circuit (IC), semiconductor chip features have become exponentially smaller and the number of transistors per device exponentially larger. Advanced IC's with hundreds of millions of transistors at feature sizes of 0.25 micrometers ("micron"), 0.18 micron, 0.10 micron, and less are becoming routine. Improvement in overlay tolerances in optical photolithography and the introduction of new light sources with progressively shorter wavelengths have allowed optical steppers to significantly reduce the resolution limit for semiconductor fabrication far below one micron.

There are various types of reticles available in the art. Binary masks comprise a pattern (e.g., an integrated circuit (IC) pattern) formed in a layer of an opaque material (e.g., chrome or chrome oxide) overlying a transparent substrate (e.g., quartz). The pattern may be formed using any lithographic technique known in the art, such as optical photolithography or electron-beam lithography.

Attenuated phase shift masks (APSMs) have provided improved image contrast and lithographic resolution over standard binary masks. An APSM comprises a layer of an optically transparent material (e.g., quartz) below a layer of an optically low-transmission material, such as molybdenum doped silicon oxynitride ($MoSi_xO_yN_z$, wherein "x", "y" and "z" are numbers greater than zero; also referred to as "MoSi" herein) or molybdenum doped silicon oxide ($MoSi_xO_y$, wherein "x" and "y" are numbers greater than zero; also referred to as "MoSiO" herein). An APSM forms shift patterns through adjacent areas of the transparent and low-transmission materials. Unlike an optically opaque material, such as chrome, MoSi allows a small percentage of light to pass through. However, the amount that passes through is "weak" and does not expose the resist on the wafer. The light that does pass through is 180° out of phase compared to the light passing through neighboring quartz areas. Therefore, where the material and the quartz meet, light interferes in such a way as to sharpen the edges of the design, producing a faithful replica of the intended pattern in the resist. Approximately 6% of light that is incident on the layer of an optically low transmission material of an APSM is transmitted through the reticle. High transmission attenuated reticles (HTARs) are similar to APSMs, with the exception that the thickness of low-transmission material layer is reduced relative to that of an APSM. Depending on the thickness of the layer of the optically low transmission material, about 18% or 30% of light that is incident on the layer of the optically low transmission material of an HTAR is transmitted through the reticle.

Manufacturing imperfections can render the quality of images formed using various reticles, such as APSMs, undesirable. For example, reticle defects, which may arise from impurities in and/or on the MoSi layer, can cause intolerable or unacceptable variations in CD's in the exposure field. To solve these problems, some manufacturers simply replace a defective reticle with a new one, which ultimately increases production costs. Other manufacturers resort to methods for cleaning reticles.

A reticle is typically cleaned by a conventional method based on RCA cleaning, typically using a mixture of an acid, such as sulfuric acid, and hydrogen peroxide (or a mixture of an alkaline agent, such as aqueous ammonia, and hydrogen peroxide), which is also widely used for cleaning wafers. In a first step, a hot mixture of sulfuric acid and hydrogen peroxide is introduced to the reticle to decompose organic objects, such as resist present on the surface of a reticle. This step improves the wettability of the surface of the reticle, thereby enhancing the efficiency of the subsequent cleaning steps. In a second step, the reticle is rinsed with hot pure water to remove residual agents, such as sulfuric acid, from the surface of the reticle. In a third step, the reticle is dipped in and cleaned with a heated or ambient temperature mixture of ammonia hydroxide and hydrogen peroxide (APM clean) for the purpose of removing foreign objects attached to the reticle. During this step, an ultrasonic wave may be applied to the dipping tank to remove foreign objects more effectively. This step, too, is typically followed by rinsing with pure water. In a final step, the reticle is dried.

The conventional cleaning process has several disadvantages. For example, the treatment with sulfuric acid/hydrogen peroxide is followed by rinsing with a large amount of pure water or hot pure water to discharge any remaining sulfuric acid. This rinsing step consumes a large amount of pure water and considerable electric energy for heating pure water, thus adding to increased processing costs. As another example, if the cleaning efficiency (yield in cleaning) is poor, the number of cleaning times required per reticle increases, which also increases processing costs.

Several alternatives to the conventional cleaning method are available. For example, U.S. Pat. No. 6,071,376, filed Jul. 27, 1998, the disclosure of which is entirely incorporated herein by reference, teaches a reticle cleaning method comprising a first step of cleaning the surface of a reticle with a hot mixture of sulfuric acid and hydrogen peroxide to decompose organic and metallic objects present thereon, a second step of removing residual sulfuric acid from the surface of the reticle using anodic water, a third step of removing foreign objects attached to the surface of said reticle with cathodic water, and a fourth step of drying the reticle. As another example, U.S. Pat. No. 7,001,470, filed Apr. 10, 2002, the disclosure of which is entirely incorporated herein by reference, teaches using ozone ($O_3$) gas solved water to eliminate organic substances adhered on a surface of a reticle. The reticle is subsequently cleaned using an alkaline chemical, such as alkaline ionized water or hydrogenated water. The reticle is dried after completion of the cleaning steps. As yet another example, a UVO cleaning device by the Jelight Company, Inc, removes organic molecules from reticles upon excitation and/or dissociation of contaminants by absorption of short-wavelength ultraviolet (UV) radiation. Dissociation of molecular oxygen with 184.9 nanometer (nm) wavelength light produces atomic oxygen that reacts with contaminant molecules to form volatile products that desorb from the reticle.

BRIEF DESCRIPTION OF THE DRAWINGS

The appended drawings are schematic, not drawn to scale, and are meant to illustrate and not to limit the invention.

DETAILED DESCRIPTION OF EMBODIMENTS

Figure 1A:
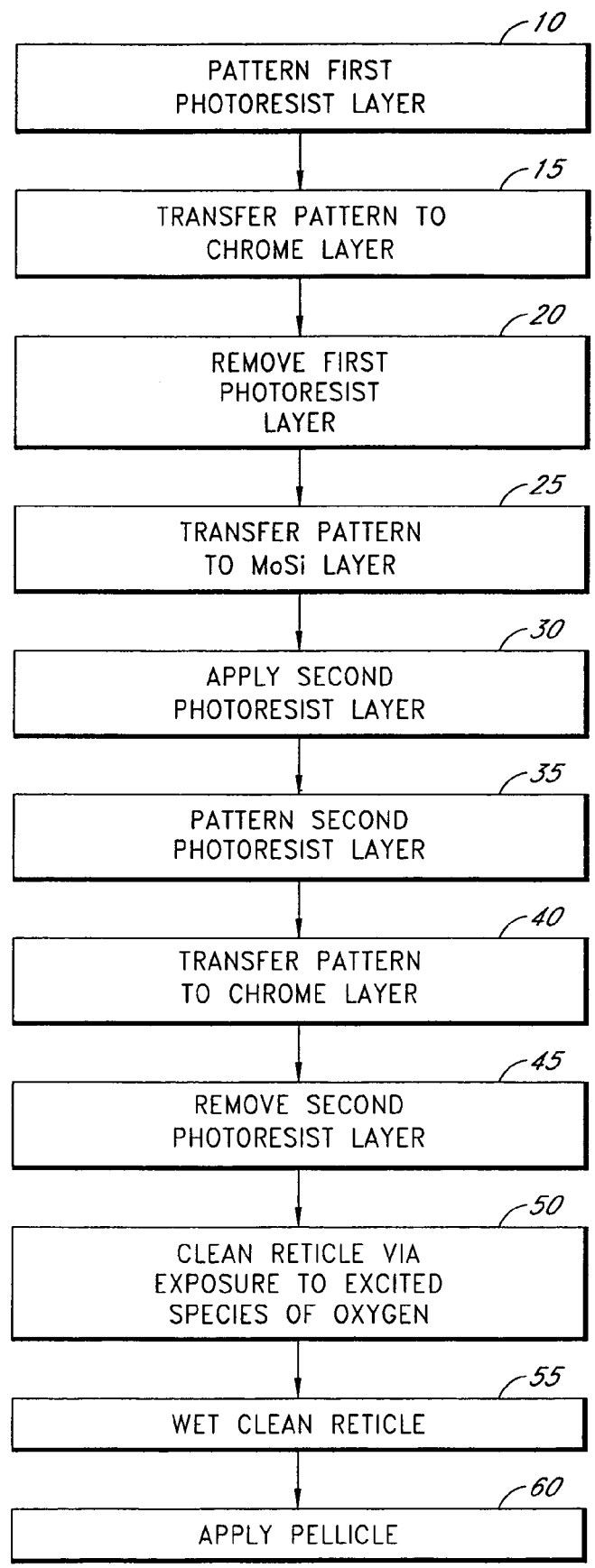
FIG. 1A is a flow chart illustrating a method for forming an APSM, in accordance with an embodiment of the invention.

Growth and agglomeration of contaminants (e.g., salts, organic contaminants) on surfaces of reticles (sometimes referred to as "fungus growth" or "haze") poses a major problem for state of the art semiconductor fabrication processes, particularly processes that use light of 193 nanometer (nm) or less wavelength to pattern photodefinable layers overlying wafers. Such contaminants can significantly distort light transmitted through the reticle, thereby adversely affecting the quality of the pattern formed in a photodefinable layer. Of particular issue is the formation and agglomeration of ammonium sulfate, which forms upon oxidation and reaction of residual sulfur contaminants on a reticle with ammonia present in the ambient atmosphere.

By removing the residual sulfur contaminants prior to exposure of a reticle to an ammonia-containing atmosphere, ammonium sulfate contaminants can be significantly reduced, if not eliminated, and the quality of reticles can be enhanced considerably.

Embodiments of the present invention provide a method for forming reticles for use in photolithography with substantially reduced levels of contaminants. According to some embodiments, following a wet strip step to remove a photodefinable layer overlying a patterned layer of a low transmission material (e.g., MoSi), the reticle is exposed to excited species of an oxidizing agent (or source chemical), such as, e.g., oxygen. Without being limited by theory, it is believed that excited species of oxygen can remove contaminants, such as residual sulfur, chlorine, carbon, carbon-containing compounds and/or sulfur-containing compounds. Volatile species, such as, e.g., $SO_2$, $O_2$, $CO$ and $CO_2$, may be formed by the exposure. Reticles with substantially reduced levels of sulfur contaminants will have correspondingly reduced levels of ammonium sulfate, and thereby provide for higher quality reticles and increased service lifespan.

It will be appreciated that "reticle" as used herein refers to a fully-formed reticle (i.e., reticle ready for use in photolithography) or a partially-formed reticle at any stage in the process of forming the reticle. A reticle can include one or more layers of an optically opaque, optically transparent, optically low transmission materials and optically high transmission materials. As used herein, "optically low transmission material" encompasses both translucent and optically opaque materials. As an example, a reticle can include a MoSi layer over a quartz substrate. As another example, a reticle can include chrome and MoSi layers over a quartz substrate. As yet another example, an in-process reticle can include a photodefinable layer over a MoSi layer that in turn overlies a quartz substrate. As still another example, a reticle can include a quartz substrate, a MoSi layer over the quartz substrate, and a pellicle over the MoSi layer. As another example, a reticle can include a quartz substrate prior to application of any overlying layers.

It will be appreciated that "excited species" as used herein can include one or more radicals, anions and cations formed from a neutral parent species. As an example, excited species of diatomic oxygen gas can include oxygen radicals, oxygen cations ($O^+$, $O_2^+$) and oxygen anions ($O^-$ and $O_2^-$). Excited species of a particular atom or molecule may be formed in a reaction space (or reaction chamber) using an in situ plasma generator, or at location external to a reaction space using a remote plasma generator. It will be appreciated that excited species can be formed by any method that transfers or couples energy to a particular species, such as irradiation with UV light, capacitive coupling (e.g., in situ RF plasmas), inductive coupling and remote microwave resonant cavity applicators.

Reticle Fabrication

Reticles formed according to some embodiments comprise a layer of an optically transparent material (e.g., quartz) and at least one layer of an optically low transmission material (e.g., MoSi, chrome). It will be appreciated that the layer of the optically low transmission material may be an optically opaque layer or an optically translucent layer.

FIG. 1A gives an overview of a process for fabricating an APSM ("also referred to as "reticle" herein) according to an embodiment. Initially, a reticle is provided comprising, from top to bottom, a first photoresist (or photodefinable) layer, a first layer of an optically low transmission material (e.g., chrome), a second layer of an optically low transmission material (e.g., MoSi), and an optically transparent material or plate (e.g., quartz). The first photoresist layer is subsequently patterned 10, which may be performed using electron beam (e-beam) lithography or laser lithography. The pattern can include features to be used for integrated circuit fabrication, e.g., memory cell arrays for volatile and non-volatile memory devices such as DRAM, ROM or flash memory, including NAND flash memory, integrated circuits having logic or gate arrays, or imagers (e.g., CMOS imagers). The pattern in the first photoresist layer is transferred 15 to the chrome layer. Pattern transfer may be accomplished using a directional (or anisotropic) etch. The first photoresist layer is then removed 20. As described in more detail below, in one embodiment, resist removal 20 employs a chemistry comprising a sulfur-containing compound (e.g., $H_2SO_4$). The pattern in the chrome layer is transferred 25 to a MoSi layer below the chrome layer. Another directional etch may be used for pattern transfer. As described in more detail below, in one embodiment, transferring 25 employs a sulfur-containing etching chemistry comprising, e.g., sulfur hexafluoride.

In an embodiment, the transfer 25 exposes portions of the quartz substrate. A second photoresist layer is applied 30 over the reticle. The second photoresist layer may cover the chrome layer and exposed portions of the quartz substrate. The second photoresist layer is patterned 35 to expose at least portions of the chrome layer. The pattern may expose the chrome in a central portion of the reticle, including most of the pattern in the MoSi layer. However, at least a portion of the chrome layer may be left unexposed, e.g., at the periphery of the pattern to serve as, e.g., placement markers. The pattern in the second photoresist layer is transferred 40 to the chrome layer. In one embodiment, this removes the chrome from the exposed regions. The second photoresist layer is removed 45. The reticle is exposed 50 to excited species of oxygen formed using, e.g., an in situ or remote plasma generator. In an embodiment, the reticle is exposed to excited species of oxygen by directing only oxygen gas into a plasma generator. In some embodiments, oxygen may is directed into the plasma generator using a carrier gas, such as, e.g., helium. Next, the reticle is wet cleaned 55 using, e.g., a wet strip, which includes applying a "piranha" mixture (sulfuric acid and hydrogen peroxide), followed by rinsing with deionized water. In an embodiment, this may be followed by de-ionized (DI) ozonated water rinse, SC1 clean, DI water cascade overflow and isopropyl alcohol (IPA) drying. A pellicle may be applied 60 to the reticle to protect it from any contaminants present in the ambient.

It will be appreciated that the reticle can be inspected for defects at any stage of the process outlined in FIG. 1A. As an example, the reticle may be inspected for defects after transfer 25 to the MoSi layer and before applying 30 the second photoresist. As another example, the reticle may be inspected for defects after cleaning 50 and before applying 55 the pellicle. It will also be appreciated that any number of "wet strip" cleaning steps may be applied throughout the process to remove various organic substances, such as material comprising the first and second photoresist layers.

Figure 1B:
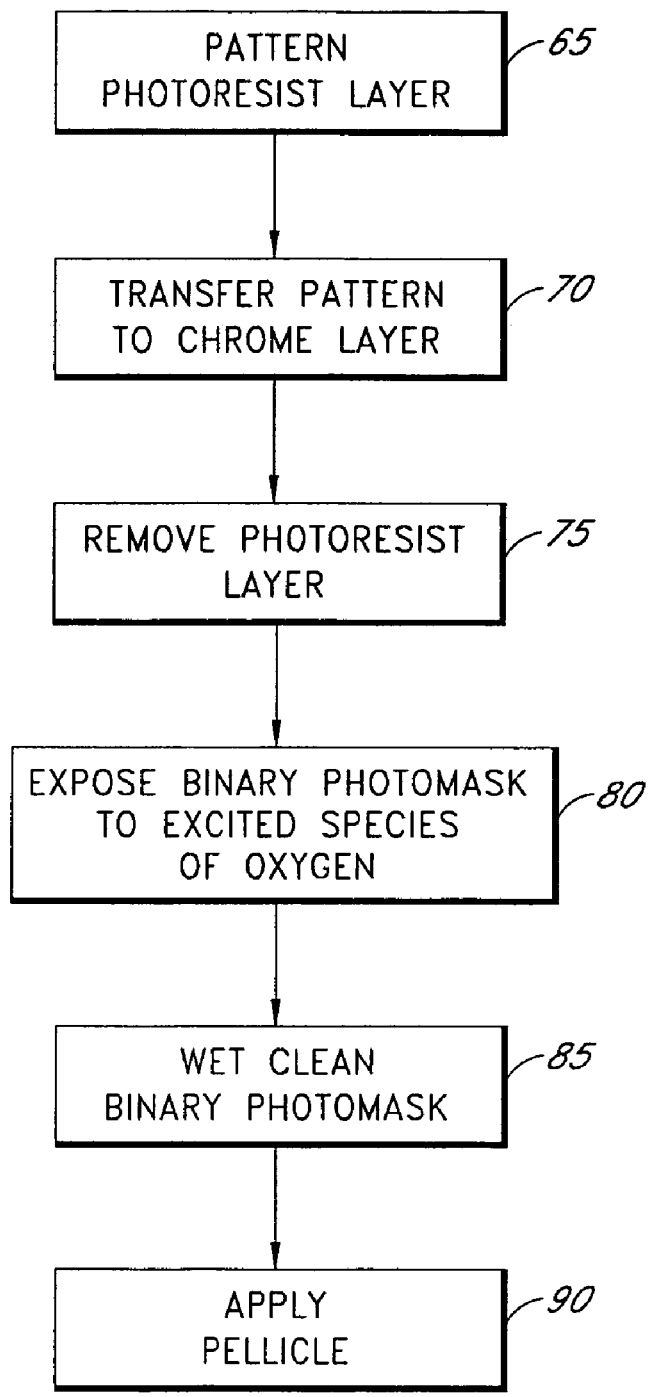
FIG. 1B is a flow chart illustrating a method for forming a binary photomask, in accordance with an embodiment of the invention.

While methods of embodiments of the invention are described in the context of APSMs, it will be appreciated that they may be applied to forming other photomasks, such as, e.g., binary photomasks and high transmission attenuated reticles (HTARs). To illustrate this, FIG. 1B gives an overview of a process for fabricating a binary photomask. Initially, a partially-formed binary photomask ("binary photomask", as illustrated) is provided comprising, from top to bottom, a first photoresist (or photodefinable) layer, a layer of an optically low transmission material (e.g., chrome or chrome oxide; chrome as illustrated) and an optically transparent material or plate (e.g., quartz). The photoresist layer is patterned 65, such as by using electron beam (e-beam) lithography or laser lithography. As described above, the pattern can include features to be used for integrated circuit fabrication, e.g., memory cell arrays for volatile and non-volatile memory devices such as DRAM, ROM or flash memory, including NAND flash memory, integrated circuits having logic or gate arrays, or imagers. In one embodiment, the pattern in the photoresist layer is transferred 70 to the chrome layer using a directional (or anisotropic) etch. In another embodiment, the pattern is transferred 70 using a sulfur-containing etching chemistry comprising, e.g., sulfur hexafluoride. The photoresist layer is then removed 75 using a chemistry comprising a sulfur-containing compound (e.g., $H_2SO_4$). Next, the binary photomask is exposed to excited species of oxygen 80 to clean the binary photomask. The binary photomask is then wet cleaned 85, as described above. Next, a pellicle is applied 90 to the binary photomask.

The process of FIG. 1A is described in more detail below with reference to FIGS. 2-10, which schematically illustrate the APSM (also "reticle" hereafter) during the process. It will be appreciated that the structures depicted in FIGS. 2-10 are for illustrative purposes only and are not intended to limit the scope of the invention. It will also be appreciated that the figures and features therein are not necessarily drawn to scale.

Figure 2:
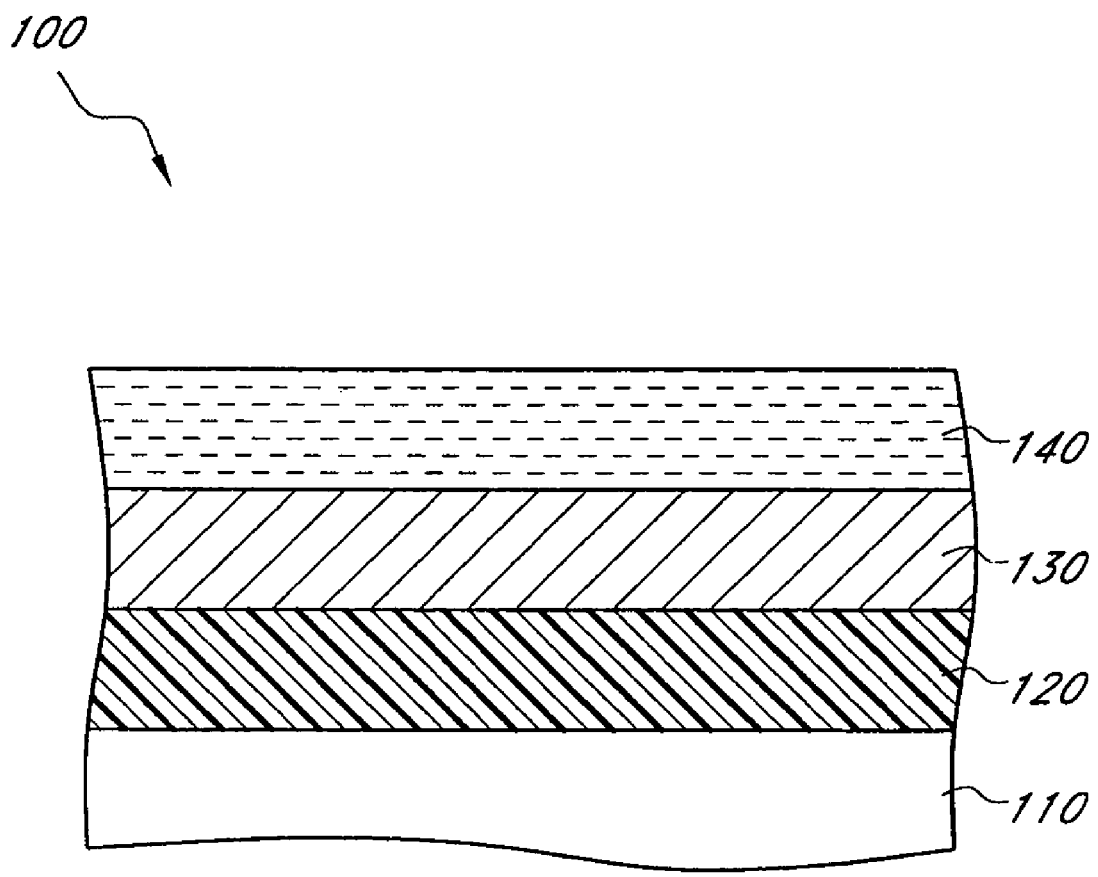
FIGS. 2-10 are schematic, cross-sectional side views illustrating a sequence of steps for forming a reticle for use in photolithography, in accordance with an embodiment of the invention.

With reference to FIG. 2, a reticle 100 is provided comprising, from bottom to top, an optically transparent substrate (or plate), at least one optically low transmission layer (in the illustrated embodiment including each of a translucent layer and an opaque layer), and a first photodefinable layer 140. The material of the translucent layer is selected from the group consisting of $MoSi_xO_yN_z$ ("MoSi"), $MoSi_xO_y$ ("MoSiO"), $Ta_xHf_y$ ("TaHf"), $Ta_xN_y$ ("TaN") and $SiO_xN_y$ ("SiON"), wherein "x", "y" and "z" are numbers greater than zero. The translucent layer serves as a transmission control and phase shift film in the illustrated embodiment. The transparent substrate of the illustrated embodiment comprises a quartz plate 110. The material of the opaque layer may be a metal or a metal alloy, such as, without limitation, chromium or chromium oxide.

In the illustrated embodiment, the translucent layer is a MoSi layer 120 ($Mo_xSiO_yN_z$), and the opaque layer is represented by a chrome layer 130. The chrome layer 130 may have a thickness between about 50 nm and 110 nm, e.g., about 59 nm, 73 nm, or 100 nm. In one embodiment, the MoSi layer 120 may have a thickness between about 50 nm and 100 nm. In another embodiment, the MoSi layer 120 may have a thickness between about 60 nm and 75 nm. The quartz substrate 110 has been sufficiently cleaned and inspected prior to application of the MoSi, chrome and photodefinable layers 120-140. Conventionally, the quartz plate 110 has a thickness between about 0.1 inch (0.24 cm) and 1.5 inches (3.6 cm). In one embodiment, the quartz plate 110 has a thickness of about 0.25 inches (6.35 mm). The MoSi and chrome layers 120 and 130 can be applied using any deposition technique known in the art, including, without limitation, chemical vapor deposition (CVD), digital CVD, atomic layer deposition (ALD) and physical vapor deposition (PVD). The photodefinable layer 140 can comprise, e.g., a chemically amplified resist material, such FEP-171 from FUJIFILM OLIN Co., Ltd. or EP-009 from Tokyo Ohka Kogyo Co., Ltd. The photodefinable layer 140 can be applied by spin-coating.

Figure 3:
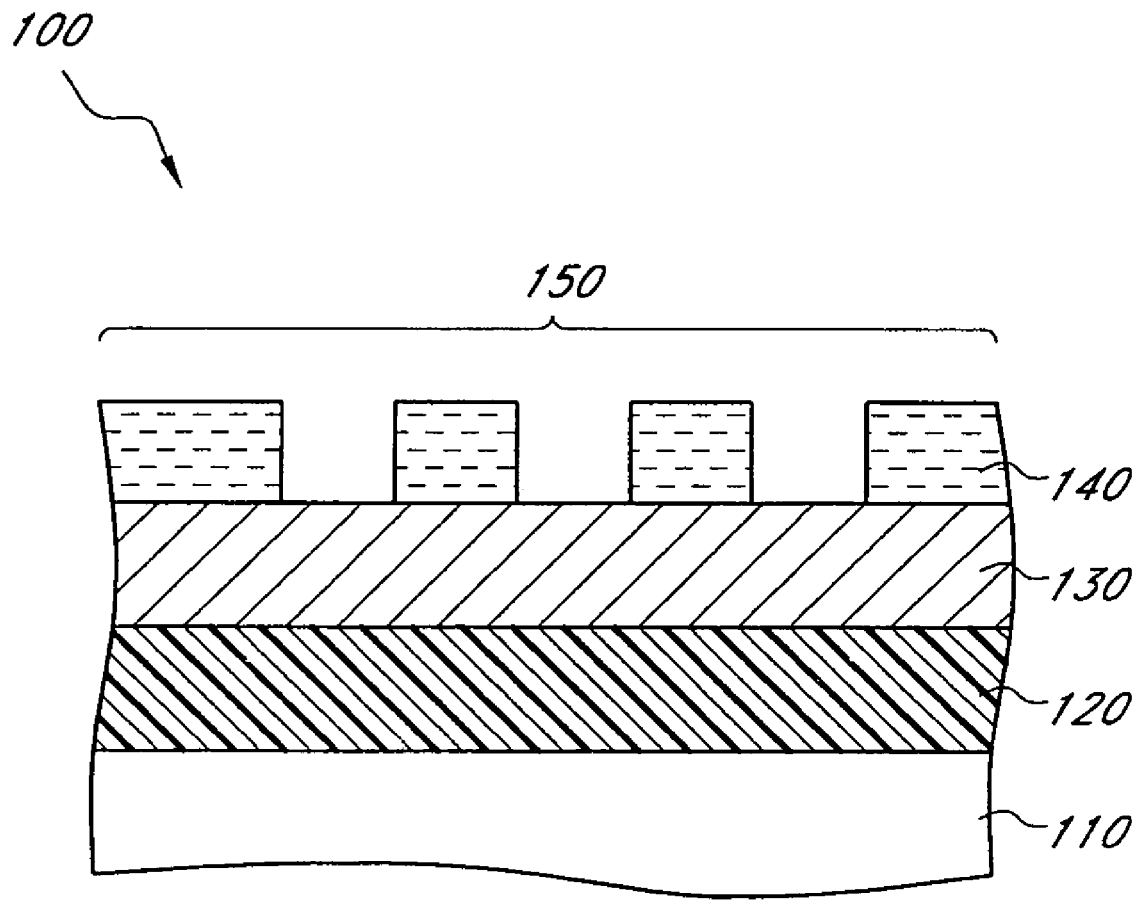

Next, with reference to FIG. 3, a pattern 150 is formed in the photodefinable layer 140 by using, e.g., electron beam (e-beam) lithography or laser lithography, to direct-write particular areas of the first photodefinable layer 140, post exposure baking (PEB), and wet developing to remove exposed portions of the resist. It will be appreciated that positive and negative resists can be used with e-beam lithography. An example of a negative resist is FUJI FEN-270, commercially available from Fuji Films. The pattern 150 can correspond to elements of features of an integrated circuit, such as, e.g., features of arrays of electrical devices, including memory cell arrays for volatile and non-volatile memory devices such as DRAM, ROM or flash memory, including NAND flash memory, integrated circuits having logic (e.g., field programmable gate array having a core array similar to a memory array and a periphery with supporting logics), gate arrays, a memory chip or a processor, which can include both a logic array and embedded memory, or any other integrated circuit having a logic or a gate array. In some embodiments, the pattern has a critical dimension (CD) between about 100 nm and 1000 nm.

Figure 4:
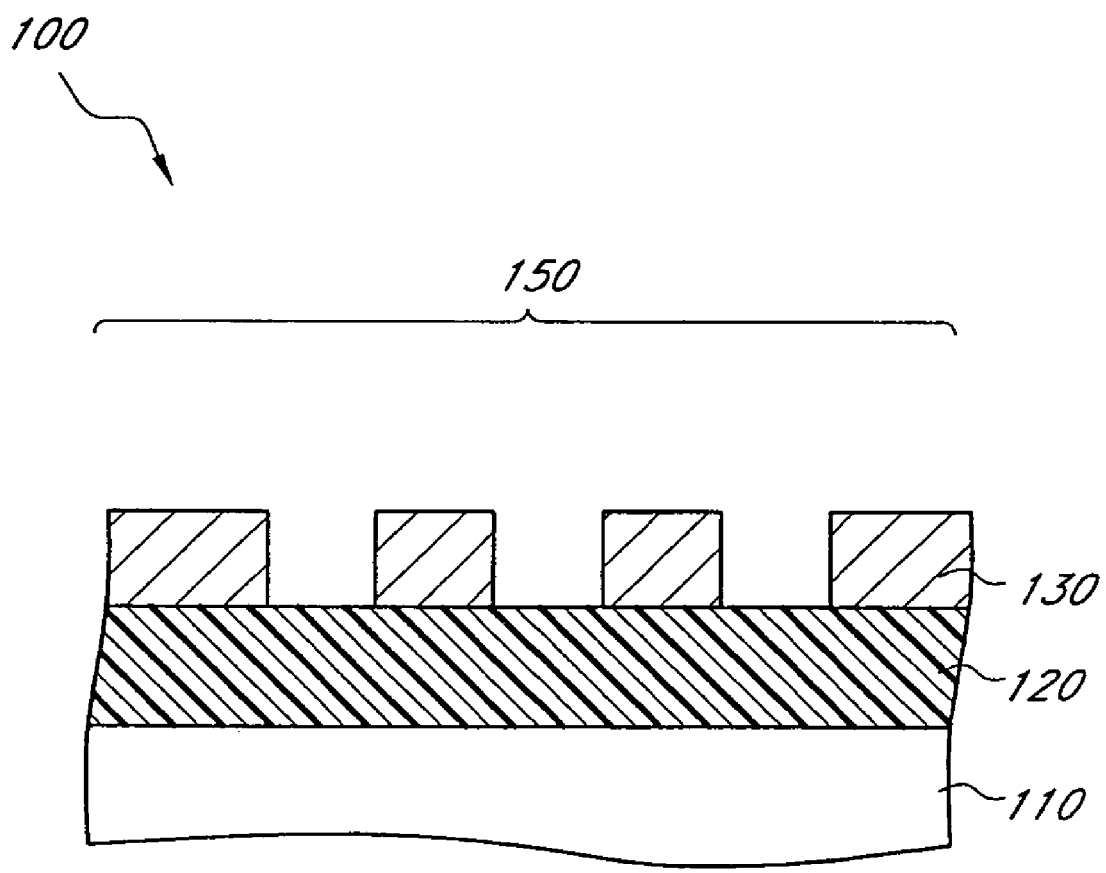

With reference to FIG. 4, the pattern 150 is transferred to the chrome layer 130. The process of etching the chrome layer 130 exposes portions of the MoSi layer 120. An etching chemistry may be selective for exposed portions of the chrome layer 130 and, in one embodiment, may be anisotropic (or directional), having a vertical component of the etch rate (i.e., component perpendicular to the quartz plate 110) substantially higher than the horizontal component (i.e., component parallel to the quartz plate 110). The chrome layer 130 may be etched using, e.g., a chlorine ($Cl_2$), oxygen ($O_2$) and helium (He) containing plasma.

With continued reference to FIG. 4, following transfer of the pattern 150 to the chrome layer 130, the first photodefinable layer 140 has been removed using, e.g., a wet strip, which includes applying a "piranha" mixture (sulfuric acid and hydrogen peroxide), followed by rinsing with deionized (DI) water. In one embodiment, this may be followed by DI ozonated water rinse, SC1 clean, DI water cascade overflow and isopropyl alcohol (IPA) drying. As an alternative, the first photodefinable layer 140 can also be removed using products of an oxygen plasma in a downstream plasma asher.

Figure 5:
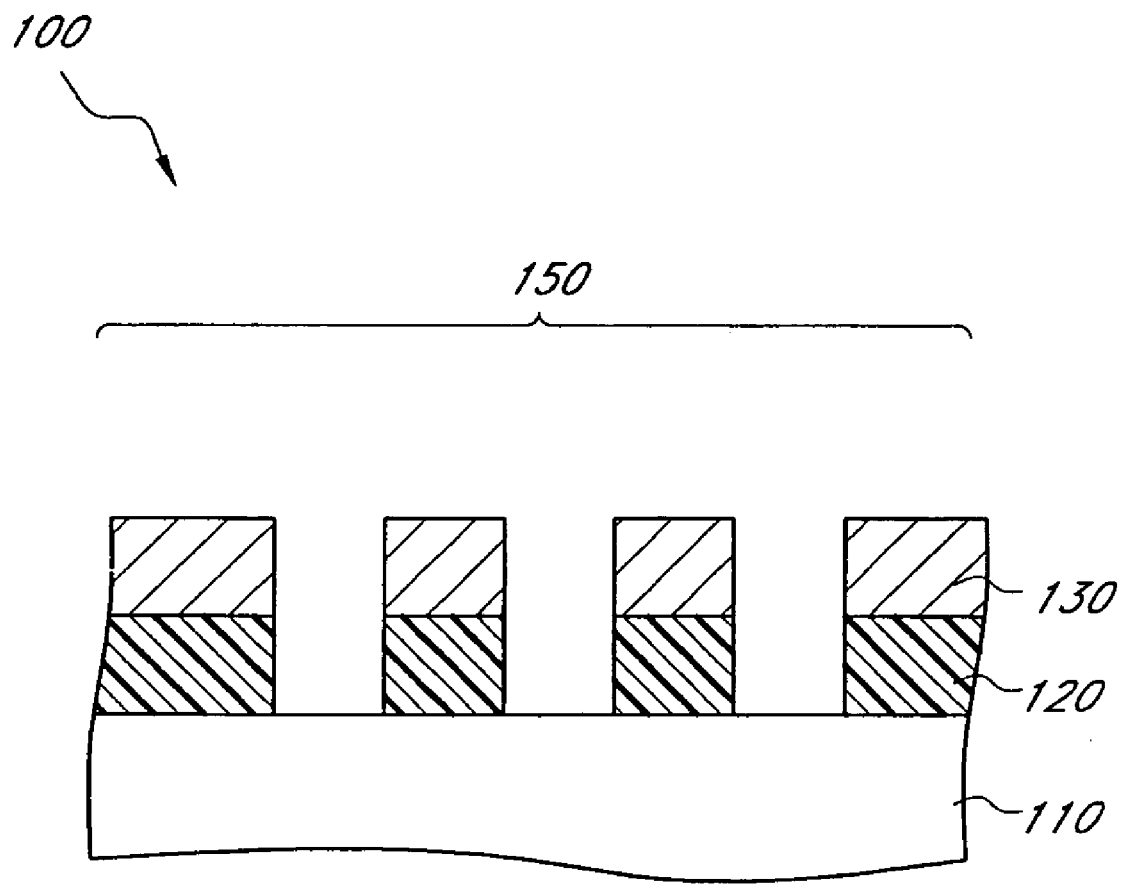

Next, with reference to FIG. 5, the pattern 150 is transferred to the MoSi layer 120 to expose portions of the quartz substrate 110. Etching may be performed using an anisotropic etching chemistry, such as plasma-activated species formed from gases including sulfur hexafluoride ($SF_6$), oxygen ($O_2$) and helium (He), or $C_2F_6$ and $O_2$. During etching, sulfur may adsorb on the reticle, such as, for example, on one or more exposed surfaces of the chrome layer 130, the MoSi layer 120 and the quartz substrate 110. The concentration of sulfur on the reticle 100 at this stage of the reticle fabrication process may be between about 2 and 5 nanograms sulfur/$cm^2$. During a subsequent etching step of the chrome layer 130 (see below), the sulfur may be converted to sulfur oxide ($SO_x$).

Figure 6:
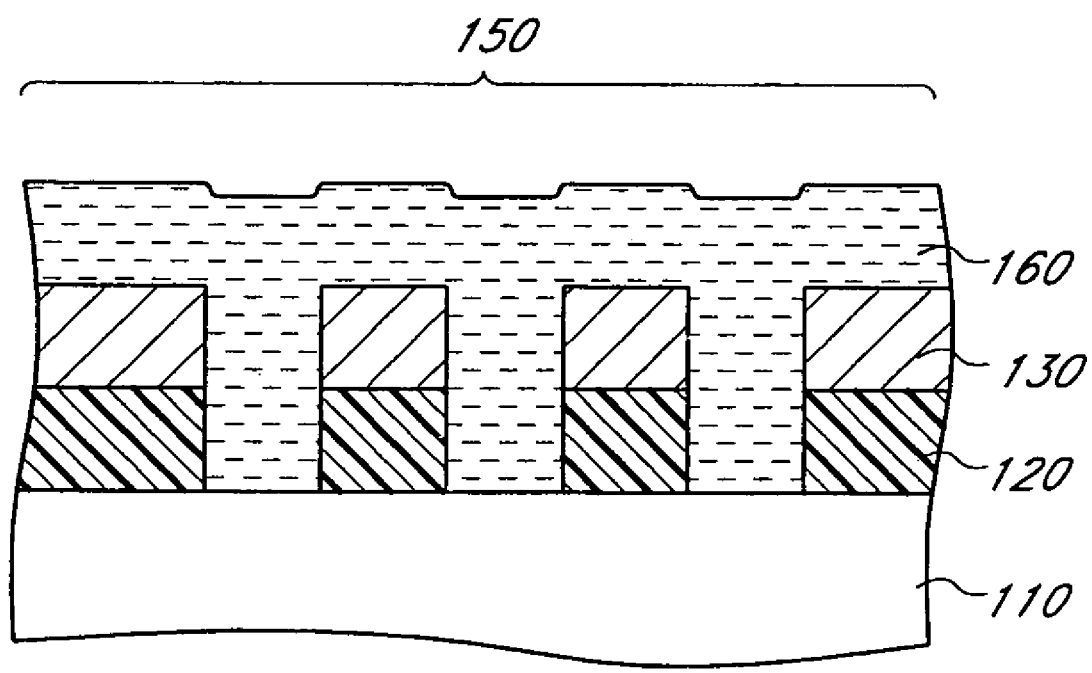

Next, with reference to FIG. 6, after optional metrology and pre-coating cleaning, a second photostep is conducted, beginning with depositing a second photodefinable layer 160 on the reticle 100. The second photodefinable layer 160 may cover the MoSi and chrome layers 120 and 130, as well as exposed portions of the quartz substrate 110. The second photodefinable layer 160 may be applied using spin coating, and may include the material of layer 140.

Figure 7:
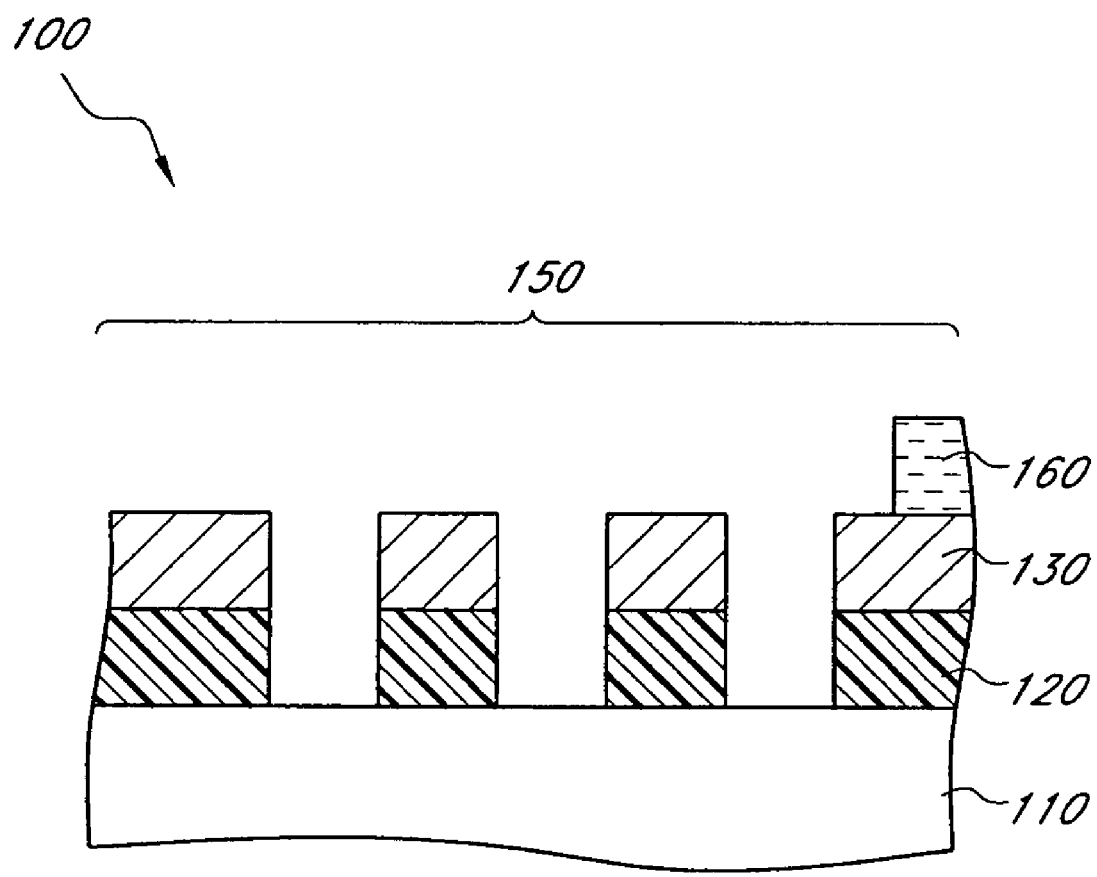

Next, with reference to FIG. 7, the second photodefinable layer 160 is patterned (as described above) to expose at least portions of the chrome layer 130. In some embodiments, most of the patterned chrome layer 130, particularly the central portion of the pattern 150, is exposed during patterning. However, it will be appreciated that portions (e.g., at the periphery of the pattern 150) of the chrome layer 130 may remain covered by the photodefinable layer 160. These residual portions of the chrome may serve as light blocking layers in some parts of the active area of the reticle 100, and in the periphery as, e.g., alignment markers for the reticle 100.

Figure 8:
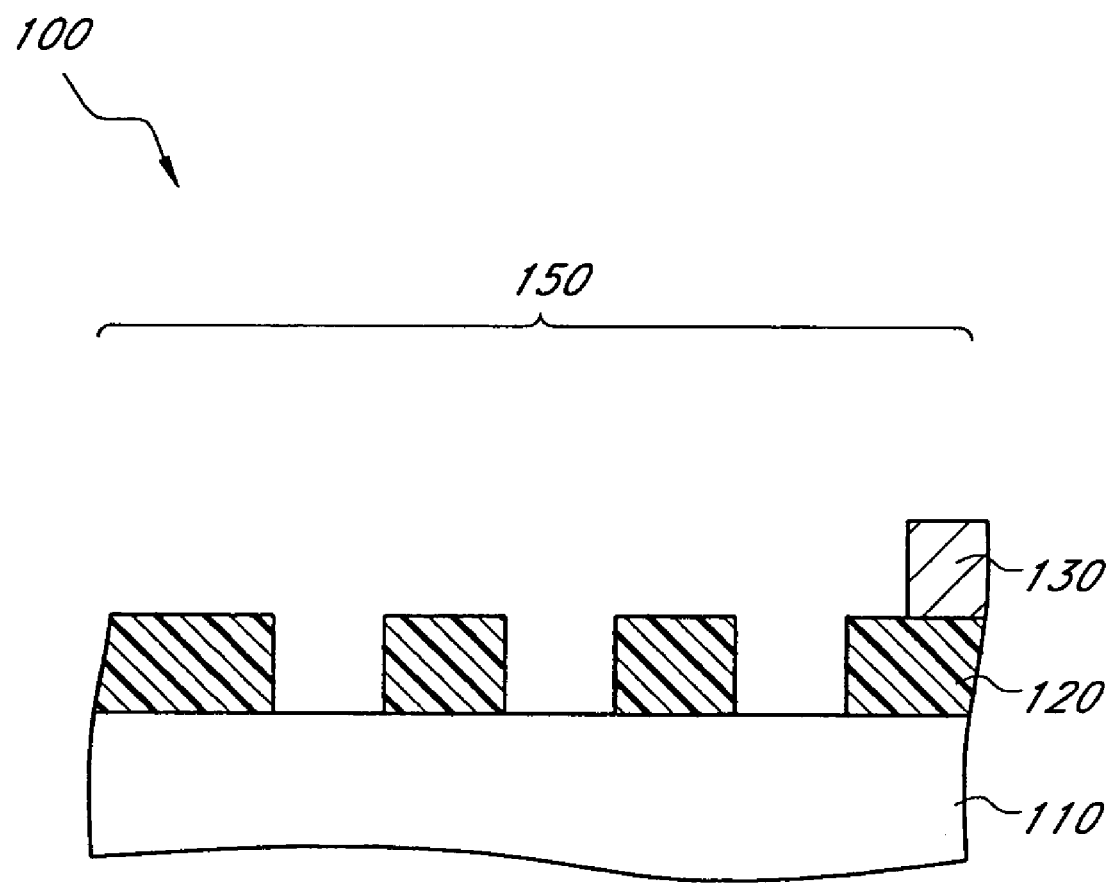

With reference to FIG. 8, exposed portions of the chrome layer 130 are etched (as described above) to expose portions of the MoSi layer 120. The central portions of the MoSi layer 120 defining the pattern 150 may be exposed in this step. The photodefinable layer 160 is subsequently removed using, e.g., a wet strip as described above.

Figure 9:
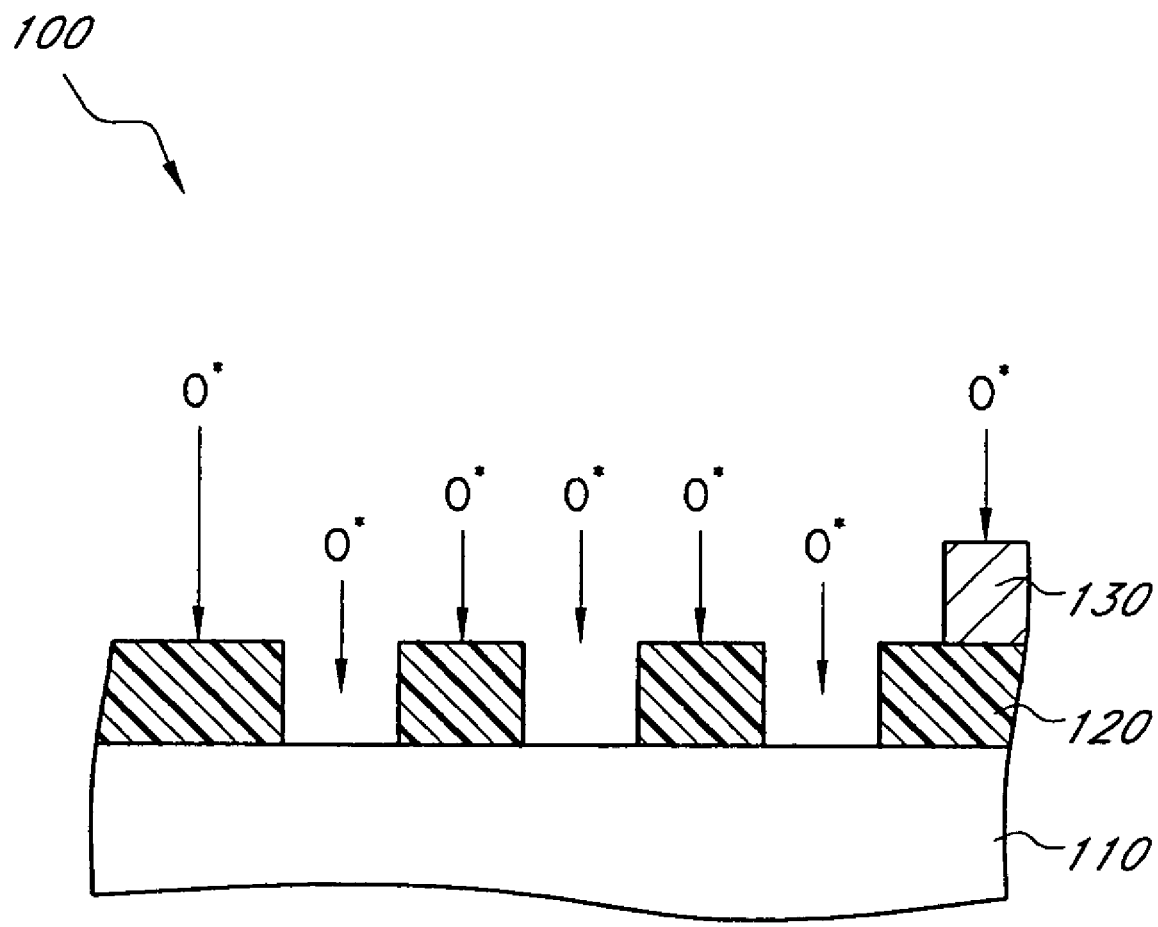

Next, with reference to FIG. 9, with the reticle 100 free of the photodefinable layer 160, the reticle 100 is exposed to an oxidizing species, such as excited species of oxygen (O*, as illustrated). As described above, O* may include neutral oxygen species (O), oxygen anions ($O_2^-$, $O^-$) and oxygen cations ($O_2^+$, $O^+$). This process may be performed in a reaction chamber (or reaction space) maintained under vacuum, such as the reaction chamber illustrated in FIG. 12 (see below). Excited species of oxygen may be formed in the reaction space using an in situ plasma generator, or at a location external to the reaction space using a remote plasma generator. In either case, excited species of oxygen may be directed to the reticle through the application of an electric field directed to the reticle. In some embodiments, the electric field is established by biasing a substrate support structure disposed below the reticle (see FIG. 12) to attract oxygen cations toward the reticle.

In one embodiment, following exposure to oxidizing species, the concentration of sulfur in and/or on the reticle 100 is less than about 3 nanograms (ng)/$cm^2$. In another embodiment, following exposure to oxidizing species, the concentration of sulfur in and/or on the reticle 100 is less than about 1 ng/$cm^2$. In yet another embodiment, following exposure to oxidizing species, the concentration of sulfur in and/or on the reticle 100 is less than about 0.5 ng/$cm^2$. In still another embodiment, following exposure to oxidizing species, the concentration of sulfur in and/or on the reticle 100 is less than about 0.1 ng/$cm^2$.

If excited species of oxygen are formed using in situ plasma generation, oxygen gas ($O_2$) is directed into a reaction space housing the reticle 100 (see FIG. 12) and power to the plasma generator is turned on to form (or ignite) the plasma. After a predetermined time period, plasma termination is terminated by, e.g., turning off the power. It will be appreciated that various plasma parameters (see below) may be modulated to control plasma generation and the rate at which sulfur is removed from the reticle 100.

Excited species of oxygen may react with sulfur on the reticle to form sulfur dioxide, which evolves into the gas phase. During exposure, the MoSi layer 120, remaining chrome layer 130 and exposed portions of the quartz substrate 110 may be simultaneously contacted with O*. Exposure of the reticle 100 to the excited species of oxygen also converts any atomic carbon, carbon-containing (e.g., $C_xO_z$, $C_xH_yO_z$ etc.) and sulfur-containing (e.g., SO) species on the reticle 100 into volatile species that are removed from the reaction space. During exposure a DC bias may establish an electric field directed to the reticle 100, which directs oxygen to the reticle 100. Volatile species may be removed by purging the reaction space with an inert gas following plasma generation with the aid of vacuum pumping (see FIG. 12). Alternatively, volatile species may be removed from the reaction space using continuous pumping in combination with inert gas (e.g., $O_2$, Ar, He, $N_2$) flow through the reaction space. In some embodiments, the exposure time is selected as desired to remove substantially all of the sulfur (and other contaminants) from the reticle. In some embodiments, during exposure of the reticle to O* the reaction space is continually pumped and/or purged to remove reaction by-products, such as, e.g., $SO_2$. Purging may be done with the aid of an inert gas, such as, e.g., nitrogen, argon, or helium.

While the oxidizing species has been described as excited species generated from oxygen gas ($O_2$), it will be appreciated that a number of suitable oxygen source gases may be used. As an example, the oxygen source gas may be nitrous oxide (NO) or nitrogen dioxide ($NO_2$). As another example, the oxygen source gas may be ozone ($O_3$).

Figure 10:
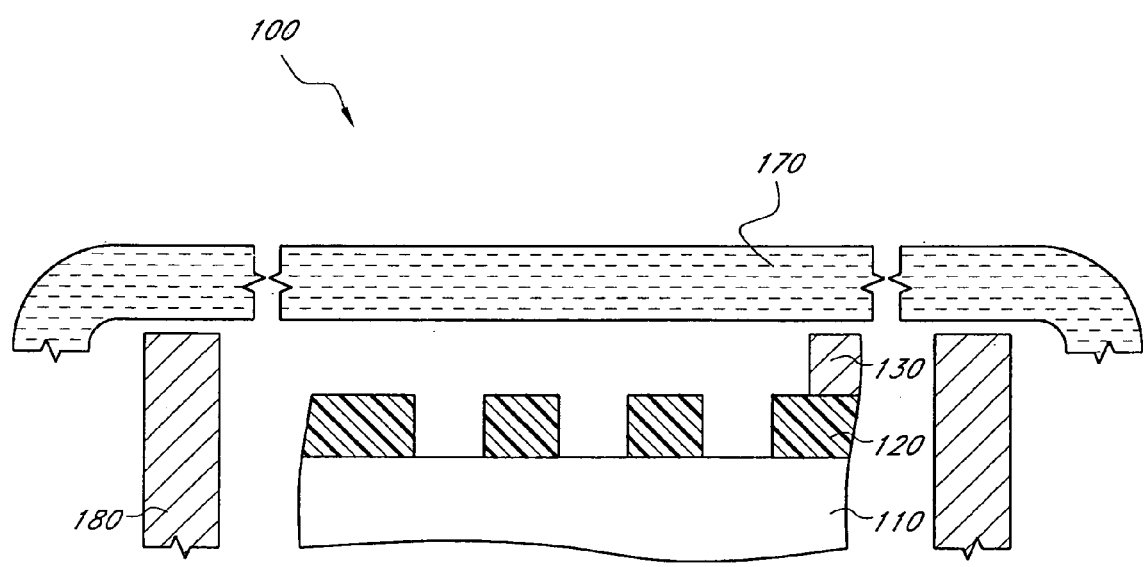

Next, with reference to FIG. 10, a protective layer (pellicle) 170 is applied to the reticle 100 to protect the reticle 100 from contaminants and damage during photolithography, handling and transport. The pellicle may be formed of a polymeric material that does not interfere with the transmission of light. The pellicle 170 may be stretched over an aluminum frame 180 surrounding the reticle 100, spaced from the optical plane of the reticle 100. The pellicle 170 may be formed of polymeric materials and, in one embodiment, may have a thickness between about 600 nm to 1000 nm. In another embodiment, the pellicle 170 may have a thickness between about 800 nm to 850 nm for use with 193 nm wavelength light. Of course, the frame 180, pellicle and quartz plate 110 dimensions are much greater than dimensions of the MoSi film 120 and chrome film 130, such that the figures are not to scale.

Thus, a reticle 100 is formed with substantially low levels of contaminants, such as ammonium sulfate and other carbon and sulfur-containing impurities. While the reticle cleaning step illustrated in FIG. 9 is applied to a reticle comprising a MoSi layer over a quartz substrate, it will be appreciated that the oxygen plasma cleaning step can be applied to reticles of different materials. For example, the phase shift and transmission control layer can be formed of a Ta or Hf-doped $SiO_xN_y$, rather than Mo doped. The opaque layer can be formed of a variety of metals besides chrome. Furthermore, the low transmission layer can be only an opaque layer (e.g., chrome) over a quartz plate, or only one phase shift and transmission control layer over a quartz plate.

In one embodiment, the concentration of sulfur contaminants on the reticle after oxygen plasma treatment is less than about 3 ng/cm$^2$. In another embodiment, the concentration of sulfur contaminants is less than about 1 ng/cm$^2$. In yet another embodiment, the concentration of sulfur contaminants is less than about 0.5 ng/cm$^2$. In still another embodiment, the concentration of sulfur contaminants is less than about 0.1 ng/cm$^2$.

It will be appreciated that the reticle 100 may be inspected at any stage of the process of FIGS. 2-10. As an example, the reticle 100 may be optically inspected for imperfections following the directional etch of the MoSi layer 120. As another example, the reticle 100 may be inspected after exposure to O* and before application of the pellicle 170.

In some cases, it may be desirable to clean an existing (or fully-formed) reticle to remove contaminants, such as ammonium sulfate contaminants, present on one or more layers of the reticle. In some cases, cleaning an existing reticle may be a more cost effective than manufacturing a new one.

Figure 11:
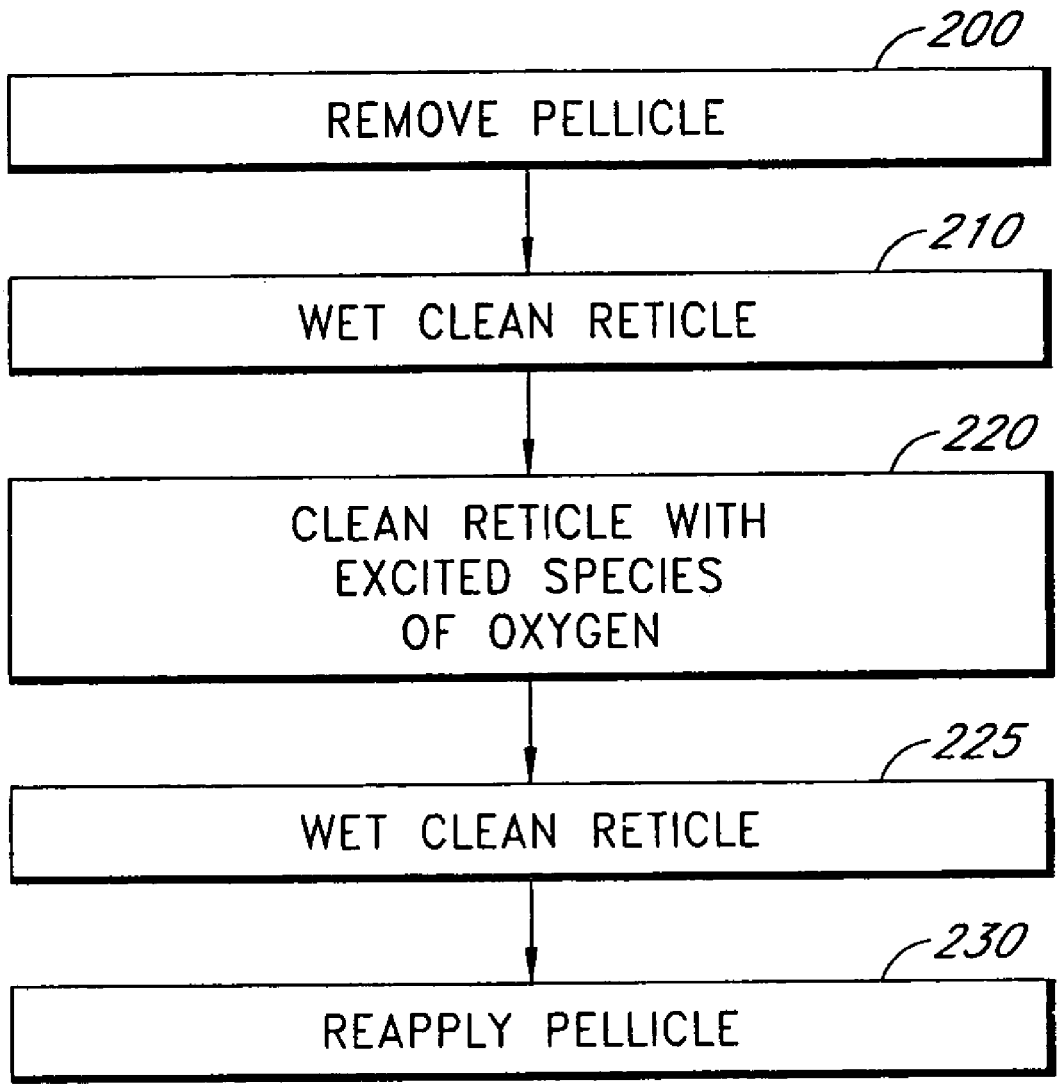
FIG. 11 is a flow chart illustrating a method for cleaning an existing reticle, in accordance with an embodiment of the invention.

FIG. 11 is a flow diagram of a series of steps that can be used to clean an existing reticle after use in photolithography. A pellicle overlying a reticle, such as the reticle 100 shown in FIG. 10, is removed 200. The pellicle and frame may be pulled off of the reticle. The reticle may then be exposed to ultraviolet light in the presence of oxygen (i.e., UV-ozone) to break down any glue or adhesive residues on the reticle. Next, the reticle is cleaned 210 using, e.g., the wet strip chemistry described above in the context of FIG. 4. The reticle is exposed 220 to excited species of oxygen to remove any sulfur, sulfur-containing and carbon-containing contaminants that may be present on the reticle. Next, the reticle is cleaned 225 using, e.g., the wet strip chemistry described above in the context of FIG. 4. The reticle may then be inspected for contaminants and other defects. Next, a new pellicle is applied 230 to the reticle. The reticle may be inspected for contaminants and defects. Contaminant levels on the reticle post-cleaning may be as described above for sulfur and also for free carbon.

Plasma Chamber for Reticle Cleaning with Oxygen Plasma

Figure 12:
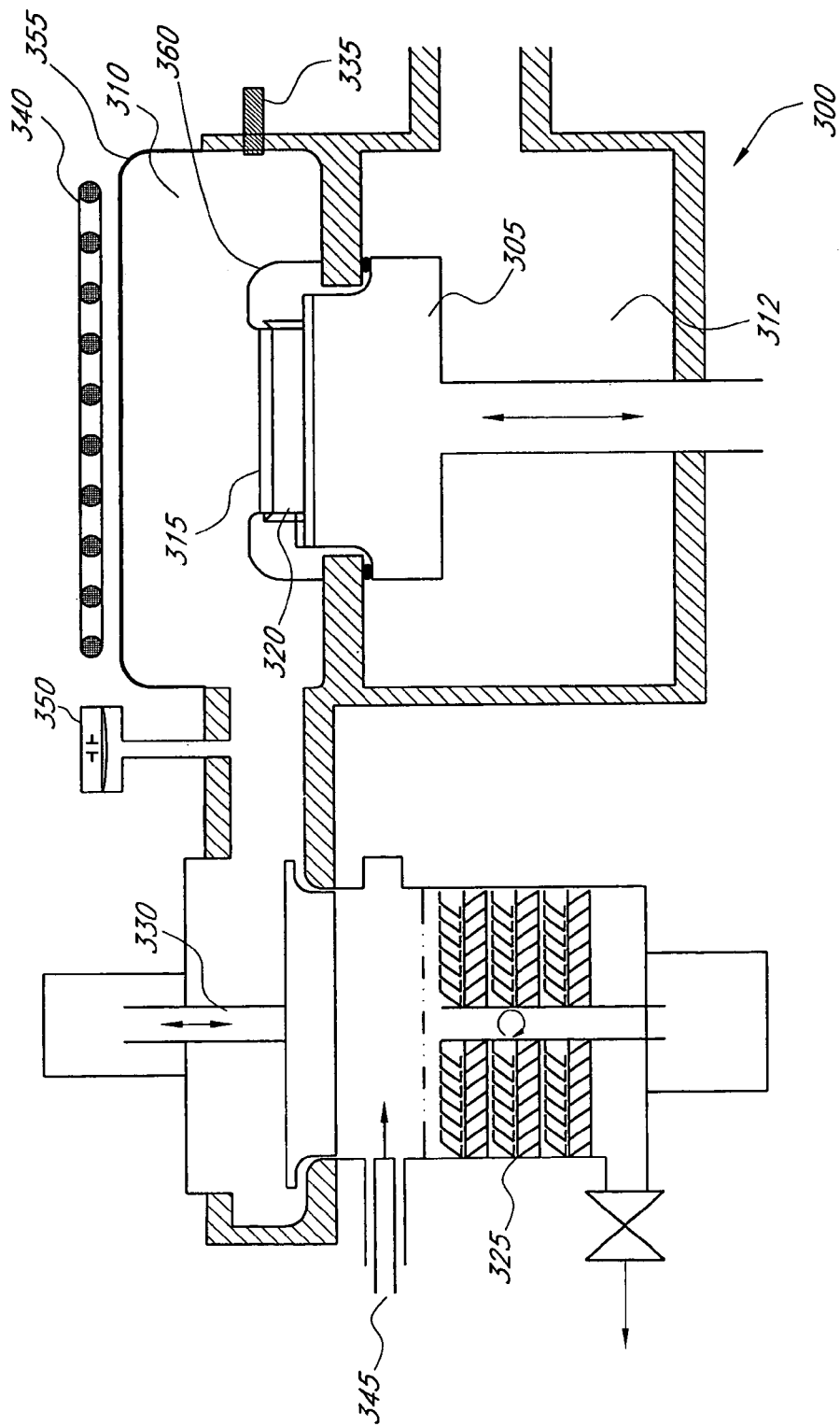
FIG. 12 is a schematic illustration of a processing chamber that can be used for cleaning reticles, in accordance with an embodiment of the invention.

An exemplary processing chamber (or reaction space) configured to perform the oxygen plasma treatment (FIG. 9) is illustrated schematically in FIG. 12. The processing chamber 300 comprises a pedestal 305 which is configured to raise and lower the substrate into and out of an upper chamber area 310. When the pedestal 305 is lowered into a lower chamber 312, the reticle can be loaded or unloaded, e.g., robotically. The reticle 315 may be disposed atop a substrate support structure 320, which can be a thermal chuck used to control the temperature of the reticle 315 during processing. The reticle 315 may include a quartz substrate, such as the quartz plate 110 described above in the context of FIGS. 2-10, and may comprise one or more layers thereon. In the illustrated embodiment, the reticle 315 comprises a MoSi layer and a chrome layer overlying a quartz substrate, as described above.

With continued reference to FIG. 12, the processing chamber 300 is maintained under vacuum by a turbomolecular ("turbo") pump 325, which is typically backed by a mechanical dry pump (not shown). A throttle valve 330 controls the pumping speed of the turbo pump and thus the rate at which gases are removed from the upper chamber area 310. The processing chamber 300 is supplied with one or more gas inlet ports 335 used to convey process gases including an oxygen source gas, such as diatomic oxygen gas ($O_2$), into the processing chamber 300. In some embodiments, the oxygen source is directed into the processing chamber 300 using an inert gas (e.g., Ar, He). The gas inlet ports 335 can also be used to convey purge gas (e.g., Ar, He, $H_2$) into the processing chamber 300.

The processing chamber 300, as illustrated, is configured for in situ (or direct) plasma generation. Radio frequency (RF) power provided to the illustrated coil 340 couples energy to the gas in the upper chamber 310, causing collisions in the gas phase to generate or ignite a plasma, including excited species (e.g., electrically neutral radicals, anions and/or cations). In some embodiments, during processing the substrate support structure 320 is biased negatively with respect to ground via application of RF energy that builds a negative charge on the substrate support structure 320, a process that is sometimes referred to as "DC self bias". As such, an electric field is established directed toward the substrate support structure 305 and hence the reticle 315. The electric field attracts cations toward the reticle 315. Cations (e.g., $O^+$, $O_2^+$) directed to the reticle 315 react with contaminants at the surface of the reticle 315 to form volatile (and neutral) by-products. In the presence of the electric field, the cations are accelerated toward the reticle 315 with a kinetic energy that may be sufficient to break the bonds of the contaminants on the reticle 315, thus increasing the rate of reaction. It will be appreciated that the bias voltage may be adjusted to control the kinetic energy of the cations.

During oxygen plasma cleaning, as described above in the context of FIG. 9, a source of oxygen, such as, e.g., diatomic oxygen gas ($O_2$), and an optional carrier gas to help support the plasma, which may be a noble gas such as helium (He), are directed into the plasma chamber 300 through a gas inlet port 335. Upon interaction with the RF source coil 340 forms excited species of oxygen. In an embodiment, excited species of oxygen are directed to the surface of the reticle 315 in the presence of an electric field, as described above. The excited species of oxygen react with contaminants on the reticle 315 to form vapor phase species that are removed from the processing chamber. As an example, the excited species of oxygen react with sulfur on the reticle (e.g., one or more of the surfaces of the chrome layer, MoSi layer and the quartz substrate) to form sulfur dioxide, which evolves into the gas phase. As another example, the excited species of oxygen react with carbon impurities present on the reticle to form vapor phase carbon and oxygen-containing species, such as, e.g., carbon monoxide and/or carbon dioxide.

The processing chamber 300 further includes a gate valve 345 to isolate the upper 310 and lower 312 chambers from the turbo pump 325; one or more capacitance monometers 350 (one illustrated), which is a pressure gauge used in the rough and high vacuum range; a dome 355 formed of a ceramic or other dielectric material, separating the RF coil 340 from the reticle 315; and a ceramic focus ring 360, which is used to maximize the density of active or excited species of oxygen over the reticle 315 and to control the flow of gas species off of the reticle 315.

The exposure time may be selected to achieve a desired concentration of contaminants on the reticle 315. In one embodiment, the exposure time may be selected to achieve a sulfur concentration of less than about 3 ng/cm$^2$. In another embodiment, the exposure time may be selected to achieve a sulfur concentration of less than about 1 ng/cm$^2$. In still another embodiment, the exposure time may be selected to achieve a sulfur concentration of less than about 0.5 ng/cm$^2$. In yet another embodiment, the exposure time may be selected to achieve a sulfur concentration of less than about 0.1 ng/cm$^2$. Following a predetermined exposure time, plasma power and/or oxygen flow into the reaction chamber 300 may be terminated, thereby stopping O* generation. An inert gas (e.g., He, Ar, N$_2$) may be introduced into the processing chamber 300 to purge reaction by-products, if any, from the reaction chamber 300. In some embodiments, with the plasma power kept ON, the flow of oxygen may be terminated and plasma formed by the inert gas (e.g., He, Ar, N$_2$) may aid maintenance of by-product volatility until purged or otherwise removed from the chamber.

The contaminant removal rate and the concentration of a contaminant on the reticle following processing can be controlled by a number of processing factors, which include, without limitation, plasma power on time, RF power amplitude, RF frequency, partial pressure and/or flow rate of the oxidizing species (e.g., O$_2$) source chemical within the processing chamber 300, pressure within the chamber 300, temperature of the reticle 315, distance between the RF source 340 and the reticle 315, and the magnitude of the DC self bias. Generation of excited species may be controlled by a computer system (not shown) configured to control various process parameters, such as pressure within the processing chamber 310, the temperature of the reticle 315, the flow rate of an oxygen source chemical (e.g., O$_2$) into the processing chamber 315, and the processing factors indicated above. The computer may be configured to control plasma generation using an in situ or external plasma generator.

In one embodiment, during processing the flow rate of oxygen gas (O$_2$) may be between about 50 standard cm$^3$/minute (sccm) and 300 sccm. In another embodiment, the flow rate of oxygen may be between about 100 sccm and 150 sccm. In one embodiment, for dual RF systems, the reactive ion etch (RIE) power may be between about 1 Watt and 40 Watts. In another embodiment, the RIE power may be between about 2 Watts and 10 Watts at an RF frequency of about 2 MHz. In one embodiment, the inductively-coupled plasma (ICP) power may be between about 400 Watts and 1000 Watts. In another embodiment, the ICP power may be between about 500 Watts and 800 Watts at an RF frequency between about 380 KHz and 420 KHz. In one embodiment, the substrate temperature may be between about 20° C. and 45° C. In another embodiment, the substrate temperature may be between about 20° C. and 30° C. In one embodiment, the processing chamber pressure may be between about 20 mTorr and 60 mTorr. In another embodiment, the processing chamber pressure may be between about 30 mTorr and 50 mTorr.

Aside from savings in processing costs, there are other benefits associated with in situ plasma generation. As an example, the contaminant removal step may be performed using reticle processing systems currently in use such that there is no need to purchase additional equipment. Additionally, for dual RF systems, a high density of excited species may be achieved due to the ICP component of input energy.

EXAMPLE

Four reticles (reticles 1-4) were processed using the methods outlined above. The reticles had a surface area of about 231 cm$^2$. Two of the reticles (reticles 1 and 2) were processed without using the oxygen cleaning method ("Untreated Reticles") outlined above in the context of FIG. 9, and two of the reticles (reticles 3 and 4) were processed using the oxygen cleaning method. Pellicles were not applied to the reticles.

Following processing, the reticles' upper surfaces were contacted for about 2 minutes with about 15 cm$^3$ of substantially high purity deionized (DI) water at a temperature of about 20° C. The water was subsequently analyzed for sulfur-containing impurities using inductively coupled plasma mass spectroscopy (ICPMS) chromatography. The concentration of sulfur-containing species in the DI water was directly correlated with the concentration of sulfur on the reticle. Tables I and II outline the results of these experiments.

TABLE I

| Untreated reticles | | |
|---|---|---|
| Reticle number | Sulfur concentration (ng/cm$^2$) | Sulfur concentration (ppb) |
| 1 | 3.5 | 54.2 |
| 2 | 3.1 | 46.8 |

TABLE II

| Treated reticles | | |
|---|---|---|
| Reticle number | Sulfur concentration (ng/cm$^2$) | Sulfur concentration (ppb) |
| 3 | 0.1 | 2.0 |
| 4 | 0.1 | 1.8 |

Thus, the oxygen cleaning step resulted in a decrease of more than 80%, and in the illustrated embodiment a 97% decrease, in the concentration of sulfur-containing impurities.

Thus, in one embodiment, a method for forming a reticle for use in photolithography is provided. The method comprises providing a first photodefinable layer over a reticle. A first pattern is formed in the first photodefinable layer. The first pattern is transferred into the reticle. The first photodefinable layer is removed to leave the reticle free of photodefinable material. While free of a photodefinable material, the reticle is contacted with excited species of oxygen.

In another embodiment, a method for removing one or more contaminants from a reticle for use in photolithography is provided. The method comprises providing a reticle comprising a patterned first layer over a plate, the reticle being free of resist. The reticle is placed in a reaction space and contacted with excited species of oxygen.

In yet another embodiment, a method for forming a reticle for use in photolithography is provided. The method comprises providing a reticle, the reticle comprising a plate, a first layer over the plate, and a photoresist layer over the first layer. The method further comprises removing the photoresist layer with a first chemistry comprising a sulfur-containing compound and removing at least a portion of the first layer with a second chemistry comprising a sulfur-containing etchant to thereby expose portions of the plate, wherein residual sulfur remains on the reticle after removing the photoresist layer and removing at least a portion of the first layer. The reticle is subsequently contacted with excited species of oxygen to clean the reticle.

In yet another embodiment, a method for cleaning a reticle for use in photolithography is provided. The method comprises providing a reticle comprising a plate of an optically transparent material, a layer of an optically low transmission material over the plate, and a pellicle over the layer of the optically low transmission material. The pellicle is removed and the reticle is subsequently contacted with excited species of oxygen.

In yet another embodiment, a reticle for use in photolithography is provided. The reticle comprises a first layer of an optically low transmission material over a substrate of an optically transparent material, the first layer having partially covering the substrate, the reticle comprising sulfur impurities at a concentration of less than about 3 ng/cm$^2$.

It will be appreciated by those skilled in the art that various other omissions, additions and modifications may be made to the methods and structures described above without departing from the scope of the invention. As an example, the reticle 100 may include a MoSiO layer, a Ta layer, a TaN layer, a Hf-doped SiO$_x$N$_y$ layer, TaHf/SiON bilayer, or a Ta/SiO$_2$ bilayer over a quartz substrate. All such modifications and changes are intended to fall within the scope of the invention, as defined by the appended claims.

We claim:

1. A method for forming a reticle for use in photolithography, comprising:
    providing a first photodefinable layer over a reticle;
    forming a first pattern in the first photodefinable layer;
    transferring the first pattern into the reticle;
    removing the first photodefinable layer to leave the reticle free of photodefinable material, wherein residual sulfur remains in and/or on the reticle after removing; and
    directing plasma-excited species of oxygen to the reticle while free of photodefinable material, wherein directing comprises applying an electric field to bias the plasma-excited species toward the reticle, wherein the residual sulfur remaining in and/or on the reticle after directing is at a concentration of less than about 3 nanograms (ng)/cm$^2$.

2. The method of claim 1, wherein the reticle comprises a first layer of a first material and a second layer of a second material under the first layer, and an optically transparent plate under the second layer.

3. The method of claim 2, wherein transferring the first pattern into the reticle comprises transferring the first pattern to the first layer to expose portions of the second layer.

4. The method of claim 3, wherein transferring the first pattern to the first layer comprises contacting exposed portions of the first layer with plasma-excited species of chlorine and oxygen.

5. The method of claim 3, wherein transferring the first pattern into the reticle further comprises transferring the first pattern to the second layer, using the first layer as a hard mask, to expose portions of the quartz plate.

6. The method of claim 5, wherein transferring the first pattern to the second layer comprises contacting exposed portions of the second layer with a sulfur-containing etchant.

7. The method of claim 6, wherein the sulfur-containing etchant comprises plasma-activated species formed from gases including SF$_6$.

8. The method of claim 5, further comprising, after removing the first photodefinable layer, forming a second photodefinable layer over the first layer, second layer and exposed portions of the quartz plate.

9. The method of claim 8, further comprising forming a second pattern in the second photodefinable layer.

10. The method of claim 9, further comprising transferring the second pattern to the first layer to expose portions of the second layer having the first pattern.

11. The method of claim 10, further comprising removing the second photodefinable layer after transferring the second pattern.

12. The method of claim 2, further comprising, after directing, forming a protective layer over the second layer and the quartz plate.

13. The method of claim 12, wherein the protective layer is a pellicle spaced from an optical plane of the reticle.

14. The method of claim 2, wherein the first material is a metal.

15. The method of claim 14, wherein the first material comprises chrome.

16. The method of claim 2, wherein the second layer is a phase shift and transmission control layer.

17. The method of claim 16, wherein the second material comprises molybdenum-doped silicon oxynitride.

18. The method of claim 2, wherein the optically transparent material comprises quartz.

19. The method of claim 1, wherein the reticle is a binary photomask with a layer of an optically low transmission material over an optically transparent plate.

20. The method of claim 19, wherein transferring the first pattern into the reticle comprises transferring the first pattern to the layer of the optically low transmission material.

21. The method of claim 20, wherein transferring the first pattern to the layer of the optically low transmission material comprises contacting exposed portions of the layer of the optically low transmission material with a sulfur-containing etchant.

22. The method of claim 1, wherein the plasma-excited species of oxygen are formed in situ over the reticle.

23. The method of claim 1, wherein the plasma-excited species of oxygen are formed by a remote plasma generator.

24. The method of claim 1, wherein forming the first pattern comprises using electron beam lithography or laser lithography.

25. The method of claim 1, wherein removing the first photodefinable layer comprises using a sulfuric acid and hydrogen peroxide mixture.

26. The method of claim 1, wherein the reticle comprises a quartz plate.

27. The method of claim 1, wherein directing comprises applying a negative electrical bias to a support structure under the reticle.

28. A method for removing one or more contaminants from a reticle for use in photolithography, comprising:
    providing a reticle comprising a patterned first layer over a plate, the reticle being free of photoresist;
    placing the reticle in a reaction space; and
    reducing sulfur concentrations of the reticle by directing plasma-excited species of oxygen to the reticle, wherein directing comprises biasing a substrate support structure disposed below the reticle and removing one or more materials selected from the group consisting of atomic sulfur and sulfur-containing compounds from the reticle, such that residual sulfur remains in and/or on the reticle after directing at a concentration of less than about 1 nanograms (ng)/cm$^2$.

29. The method of claim 28, wherein the first layer comprises silicon oxynitride and the plate comprises quartz.

30. The method of claim 29, wherein the first layer is doped with a metal and is configured to serve as a phase shift and transmission control layer.

31. The method of claim 30, wherein the reticle further comprises an opaque layer partially covering the patterned first layer.

32. The method of claim 28, wherein directing further comprises removing one or more materials selected from the group consisting of atomic carbon and carbon-containing compounds from the reticle.

33. The method of claim 28, wherein directing comprises forming vapor phase sulfur dioxide ($SO_2$).

34. The method of claim 28, wherein directing comprises applying a negative electrical bias to the support structure below the reticle.

35. The method of claim 28, wherein the reticle is an attenuated phase shift mask (APSM).

36. The method of claim 28, wherein the reticle is a binary photomask.

37. A method for forming a reticle for use in photolithography, comprising:
   providing a reticle comprising a plate, a first layer over the plate, and a photoresist layer over the first layer;
   removing the photoresist layer with a first chemistry comprising a sulfur-containing compound;
   removing at least a portion of the first layer with a second chemistry comprising a sulfur-containing etchant to expose portions of the plate, wherein residual sulfur remains in and/or on the reticle after removing the photoresist layer and removing at least a portion of the first layer; and
   subsequently directing plasma-excited species of oxygen to the reticle to clean the reticle, wherein directing comprises applying an electric field to bias the plasma-excited species of oxygen toward the reticle, wherein the residual sulfur remaining in and/or on the reticle after directing is at a concentration of less than about 3 nanograms (ng)/cm$^2$.

38. The method of claim 37, wherein the first layer comprises metal-doped silicon oxynitride.

39. The method of claim 38, wherein the first layer comprises molybdenum-doped silicon oxynitride.

40. The method of claim 37, further comprising removing excess excited species of sulfur dioxide from the reaction space after contacting the reticle.

41. The method of claim 37, wherein directing generates sulfur dioxide ($SO_2$).

42. The method of claim 37, wherein the sulfur-containing compound includes sulfuric acid ($H_2SO_4$).

43. The method of claim 37, wherein the sulfur-containing etchant includes plasma activated species of sulfur hexafluoride ($SF_6$).

44. The method of claim 37, wherein the plate comprises quartz.

45. The method of claim 37, wherein directing comprises applying a negative electrical bias to a support structure below the reticle.

46. A method for cleaning a reticle for use in photolithography, comprising:
   providing a reticle comprising a plate of an optically transparent material, a layer of an optically low transmission material over the plate, and a pellicle over the layer of the optically low transmission material;
   removing the pellicle; and
   subsequently directing plasma-excited species of oxygen to the reticle, wherein directing comprises electrically biasing a substrate support structure disposed below the reticle, wherein the residual sulfur remaining in and/or on the reticle after directing is at a concentration of less than about 1 nanogram (ng)/cm$^2$.

47. The method of claim 46, further comprising applying a pellicle over the optically low transmission material layer after directing.

48. The method of claim 1, wherein the residual sulfur remaining in and/or on the reticle after directing is at a concentration of less than about 1 nanograms (ng)/cm$^2$.

49. The method of claim 1, wherein the residual sulfur remaining in and/or on the reticle after directing is at a concentration of less than about 0.5 nanograms (ng)/cm$^2$.

50. The method of claim 37, wherein the residual sulfur remaining in and/or on the reticle after directing is at a concentration of less than about 1 nanograms (ng)/cm$^2$.

51. The method of claim 37, wherein the residual sulfur remaining in and/or on the reticle after directing is at a concentration of less than about 0.5 nanograms (ng)/cm$^2$.

* * * * *